(12) United States Patent
Wasekura

(10) Patent No.: US 8,717,068 B2
(45) Date of Patent: May 6, 2014

(54) DRIVE UNIT FOR DRIVING VOLTAGE-DRIVEN ELEMENT

(75) Inventor: Masaki Wasekura, Toki (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 13/256,858

(22) PCT Filed: May 19, 2011

(86) PCT No.: PCT/JP2011/061563
§ 371 (c)(1),
(2), (4) Date: Sep. 15, 2011

(87) PCT Pub. No.: WO2012/157118
PCT Pub. Date: Nov. 22, 2012

(65) Prior Publication Data
US 2014/0062541 A1    Mar. 6, 2014

(51) Int. Cl.
*H03B 1/00* (2006.01)
*H03K 3/00* (2006.01)

(52) U.S. Cl.
USPC .......................................... 327/108; 327/112

(58) Field of Classification Search
USPC ................................................. 327/108, 112
See application file for complete search history.

(56) References Cited

U.S. PATENT DOCUMENTS

| 7,514,967 B2* | 4/2009 | Higashi et al. | 327/108 |
| 7,551,004 B2* | 6/2009 | Okazaki et al. | 327/108 |
| 8,410,825 B2* | 4/2013 | Wasekura | 327/108 |
| 2012/0025897 A1 | 2/2012 | Wasekura | |

FOREIGN PATENT DOCUMENTS

| JP | A-2002-23867 | 1/2002 |
| JP | A-2006-324963 | 11/2006 |
| JP | A-2007-156521 | 6/2007 |
| WO | WO 2012/014314 A1 | 2/2012 |

* cited by examiner

*Primary Examiner* — Hai L Nguyen
(74) *Attorney, Agent, or Firm* — Oliff PLC

(57) ABSTRACT

A controller of a drive unit is configured so as to control a voltage supplied to a gate resistor of a voltage-driven element by using of a voltage of a feedback connector when an electrical connection between the feedback connector and the gate resistor of the voltage-driven element is ensured. Further, the controller of the drive unit is configured so as to control the voltage supplied to the gate resistor of the voltage-driven element by using of a voltage of an output connector when the electrical connection between the feedback connector and the gate resistor of the voltage-driven element is not ensured.

7 Claims, 8 Drawing Sheets

FIG. 5

DRIVE UNIT FOR DRIVING VOLTAGE-DRIVEN ELEMENT

TECHNICAL FIELD

The present invention relates to a drive unit for driving a voltage-driven element.

BACKGROUND ART

A voltage-driven element is an element capable of performing a specific function using a driving voltage, and is widely used in various applications. In an example of the voltage-driven element, a voltage-driven switching element comprising an insulated gate is known. The voltage-driven switching element controls a current value based on a gate voltage (an example of the driving voltage) supplied to the insulated gate, and is used, e.g., in an inverter system that converts a direct current voltage to an alternating current voltage. A power semiconductor switching element that includes an IGBT (Insulated Gate Bipolar Transistor) and a MOSFET (Metal Oxide Semiconductor Field Effect Transistor) can be given as an example of the voltage-driven switching element.

In order to drive this type of the voltage-driven element, a drive unit is connected to the voltage-driven element. The drive unit is configured to control the driving voltage supplied to the voltage-driven element. The drive unit can control the driving voltage based on a control signal that commands on/off of the voltage-driven element. The drive unit can also control the driving voltage based on a signal representing a driving state of the voltage-driven element, or a signal representing a state of the external environment.

In this type of the drive unit, development of a technique to generate a high precision driving voltage is desired. If the precision of the driving voltage generated by the drive unit is low, the driving conditions of the voltage-driven element must be set taking the precision of the driving voltage into consideration. Consequently, if the precision of the driving voltage is low, the voltage-driven element cannot be driven under optimal conditions. Consequently, problems such as an increase in a surge voltage of the voltage-driven element, or an increase in power loss of the voltage-driven element occur.

An example of the drive unit capable of generating a high precision driving voltage is taught in Japanese Patent Application Publication No. 2006-324963. This drive unit is characterized to generate the high precision driving voltage by a feedback control of the driving voltage supplied to the gate resistor of the voltage-driven element. Specifically, by comparing the driving voltage with a high precision reference voltage, the driving voltage is controlled based on the results of this comparison. Since this drive unit can generate the high precision driving voltage, it can provide useful results for many purposes.

SUMMARY OF INVENTION

Technical Problem

When an output connector of the drive unit is directly connected to the gate resistor of the voltage-driven element, the driving voltage supplied to the gate resistor may be precisely controlled by the feedback control of the voltage of the output connector. However, there are cases in which some kind of circuits needs to be disposed between the output connector of the drive unit and the gate resistor of the voltage-driven element. For example, there is a need to dispose a current amplifier between the output connector of the drive unit and the gate resistor of the voltage-driven element to drive a high-capacity voltage-driven element.

In such a case, the output connector of the drive unit and the gate resistor of the voltage-driven element are indirectly connected via the current amplifier. Therefore, in order to control the driving voltage supplied to the gate resistor of the voltage-driven element with precise feedback control, a feedback connector, which is directly connected to the gate resistor of the voltage-driven element, should be provided in addition to the output connector. Accordingly, if the output connector and the feedback connector are provided respectively and the feedback connector opens, then the feedback control becomes disabled. It results in a problem that the driving voltage rises toward a power-supply voltage. Note that there are many kinds of reasons to provide the output connector and the feedback connector respectively, and the above-mentioned current amplifier circuit is one example. For example, there is a reason to provide a circuit element only on the feedback path. Even in this case, it is desired to provide the output connector and the feedback connector respectively. A circuit for regulating the feedback by providing an outer resistor only on the feedback path can be given as an above example. Also, a circuit for compensating a phase by providing a parallel circuit of an outer resistor and the capacitor only on the feedback path can be given as an above example.

The technique taught in the present specification aims to teach a technique which maintains the feedback control even if the feedback connector provided separately from the output connector opens.

Solution to Technical Problem

The drive unit taught in the present specification is characterized in that a path is provided to maintain the feedback control even if the feedback connector opens. In the drive unit taught in the present specification, when an electrical connection between the feedback connector and the gate resistor of the voltage-driven element is ensured (normal status), a voltage of the feedback connector is under the feedback control and a voltage supplied to the gate resistor of the voltage-driven element can be controlled. On the other hand, when the electrical connection between the feedback connector and the gate resistor of the voltage-driven element is not ensured (abnormal status), a voltage of the output connector is under the feedback control and the voltage supplied to the gate resistor of voltage-driven element can be controlled. As mentioned above, the drive unit taught in the present specification is configured so as to control the feedback control in both of the normal status and the abnormal status so that a phenomenon of the driving voltage supplied to the voltage-driven element to rise up to the power-supply voltage can be avoided.

BRIEF DESCRIPTION OF DRAWINGS

FIG. 5 shows a configuration of a drive unit of a modified example of the first embodiment;

DESCRIPTION OF EMBODIMENTS

Figure 1:
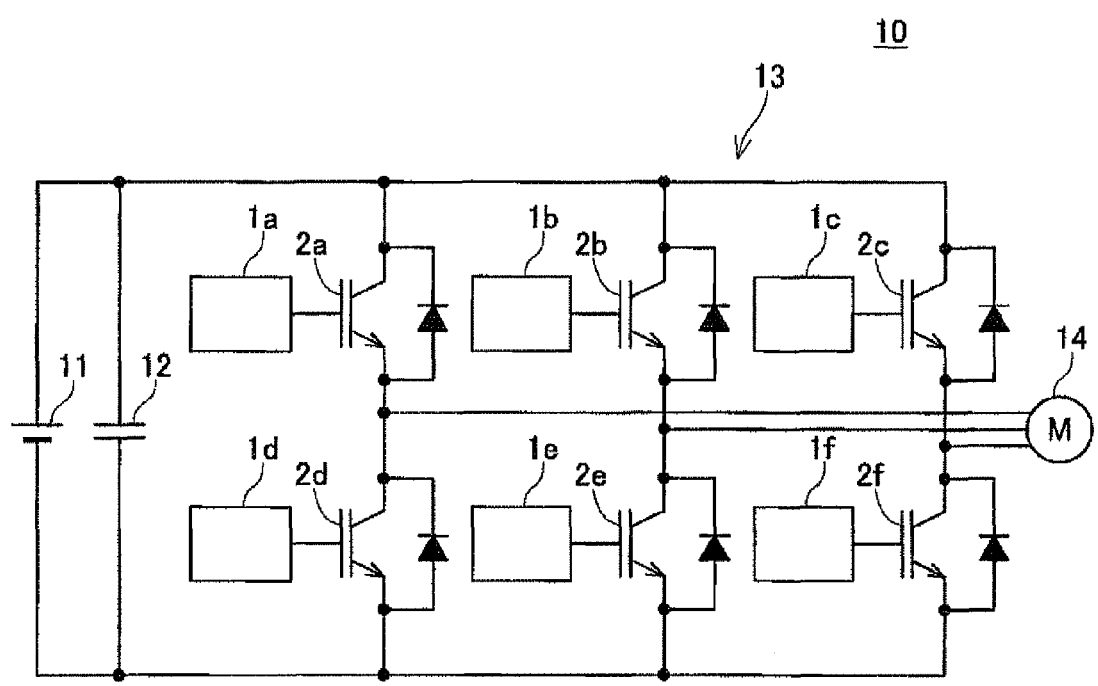
FIG. 1 shows a configuration of an inverter system.

A drive unit taught in the present specification is used for driving a voltage-driven element. Here, the voltage-driven element is an element capable of performing a specific function using a driving voltage. The voltage-driven element may be a voltage-driven switching element having an insulated gate, and in particular may be a power semiconductor switching element. An IGBT, MOSFET, and thyristor may be included in the power semiconductor switching element. The drive unit may comprise a first connector, a feedback connector, a second connector, a switching element, and a controller. The first connector is configured so as to be connected to a gate resistor of the voltage-driven element. Here, the first connector may be directly connected to the gate resistor of the voltage-driven element, or may be indirectly connected to the gate resistor of the voltage element via other circuits. The feedback connector is also configured so as to be connected to the gate resistor of the voltage-driven element. It is preferable that the feedback connector is directly connected to the gate resistor of the voltage-driven element. The second connector is configured so as to be connected to a driving power source. The second connector may be directly connected to the driving power source, or may be indirectly connected to the driving power source via other circuits. A first input-output electrode of the switching element is connected to the first connector, and a second input-output electrode of the switching element is connected to the second connector. An example of the switching element may include a voltage-driven switching element having an insulated gate. It is desirable for an element with a rapid switching speed to be used in the switching element. Consequently, it is desirable for a MOSFET to be used in the switching element. The controller is connected to a control electrode of the switching element, and controls a voltage input to the control electrode of the switching element. The controller may include an error amplifier, a reference power source, and a resistance member. One input connector of the error amplifier is connected to the reference power source, an other input connector of the error amplifier is connected to the feedback connector, and an output connector of the error amplifier is connected to the control electrode of the switching element. It is desirable for the error amplifier to be configured so as to amplify an error between the two input connectors and output it. An example of the error amplifier may include an operational amplifier. Further, another example of the error amplifier may include a circuit constituted of an A/D converter, a digital signal processing circuit, and a D/A converter. One end of the resistance member is connected to the first connector, and the other end of the resistance member is connected to a line between the other input connector of the error amplifier and the feedback connector. Many kinds of elements having a resistance component can be used as the resistance member. The resistance member may be a fixed resistance or a variable resistance. For example, a fixed resistor or a diode connected in a forward direction can be used as the resistance member. In the above-mentioned drive unit, if the feedback connector opens, a voltage of the first connector is controlled by the feedback control via the resistance member. The above-mentioned drive unit is configured so as to avoid a phenomenon of the driving voltage supplied to the voltage-driven element to rise up to the power-supply voltage.

In the drive unit taught in the present specification, it is preferable that the controller further includes a switch. One end of the switch is connected to the second connector, and an other end of the switch is connected to the control electrode of the switching element. In the drive unit, when the switch closes, the second input-output electrode of the switching element and the control electrode are short-circuited, thus the switching element turns off. Therefore, the supply of driving voltage to the voltage-driven element is stopped when the switch is closed. When the switch opens, the switching element turns on, and the driving voltage is supplied to the voltage-driven element. This drive unit is characterized in that the switch for switching the controller on/off is positioned between the second connector and the control electrode of the switching element, and not positioned on the feedback path. In general, since there is a mismatch of a resistance component in each of switches, there is a possibility that a feedback characteristic may also vary according to switches if such switches are provided on the feedback path. In this drive unit taught in the present specification, the switch for switching the controller on/off is not provided on the feedback path, thus the driving voltage supplied to the gate resistor of the voltage-driven element is controlled with the high precision.

In the drive unit taught in the present specification, the switch may open in synchrony with a turn-on of the voltage-driven element. Here, "in synchrony" typically includes the case of the time coinciding exactly within a range of control precision required by the voltage-driven element or drive unit. Further, "in synchrony" also includes the case of operation based on a common signal. "In synchrony" may include, e.g., the case where a signal commanding the switch to open/close and a signal commanding the voltage-driven element to be turned on are in common and, as long as those signals are in common, the term may even include the case where the time of making the switch open/close and the time of turning on the voltage-driven element do not coincide. The surge voltage and switching loss of the voltage-driven element strongly affect the switching speed of the voltage-driven element. Consequently, in order to improve the surge voltage and switching loss of the voltage-driven element, it is important to supply a high precision driving voltage at the time of turning on the voltage-driven element. By making the switch open in synchrony with the turn-on of the voltage-driven element, the drive unit can supply the high precision driving voltage in synchrony with the turn-on of the voltage-driven element. Consequently, the surge voltage and switching loss of the voltage-driven element can be improved.

In the drive unit taught in the present specification, the controller may further include a current detector which detects a current flowing in the resistance member. This drive unit can decide when the feedback connector opens by using a value of a current flowing in the current detector.

In the drive unit taught in the present specification, the controller may further include a protection element. The protection element can be connected in parallel with the current detector, and be configured so as to conduct at and over a predetermined voltage. Hence, the predetermined voltage is higher than an operating voltage of the current detector. This type of the protection element normally does not disturb an operation of the current detector. On the other hand, when an excessive voltage (e.g. electrostatic discharge sensitive devices: ESD) is applied to the current detector, the protection element preferentially conduct, then protect the current detector from a breakage by the excessive voltage.

The current capacity of the voltage-driven element is large in the case where the voltage-driven element handles high power, e.g. such as in the case where the voltage-driven element is mounted in an inverter system for a vehicle. The current capacity of the switching element of the drive unit must also be increased in order to drive the voltage-driven element having a large current capacity in a short period of time. When the current capacity of the switching element increases, the slew rate of the error amplifier must also be increased. However, when the slew rate of the error amplifier is increased, steady-state loss of the error amplifier increases. One embodiment of the drive unit to solve the aforementioned problem may further comprise a current amplifier circuit amplifying an output current output from the first connector and providing this amplified output current to the gate resistor. By providing the current amplifier circuit, the voltage-driven element having a large current capacity can be driven for a short time without increasing the current capacity of the switching element. Consequently, since the slew rate of the error amplifier of the controller need not be increased, an increase in the steady-state loss of the error amplifier can also be avoided.

EMBODIMENT

Below, embodiments will be described with reference to the figures. Moreover, common components in the embodiments will have common reference numbers appended thereto, and an explanation thereof will be omitted.

First Embodiment

FIG. 1 shows a basic configuration of an inverter system 10 mounted in a vehicle. The inverter system 10 comprises a DC power supply 11, a smoothing capacitor 12, and an inverter unit 13. The inverter unit 13 comprises six voltage-driven elements 2a-2f, and six drive units 1a-1f that drive the voltage-driven elements 2a-2f. An IGBT is used in the respective voltage-driven elements 2a-2f. The six voltage-driven elements 2a-2f constitute a three-phase bridge connection. Diodes used for a return current are connected antiparallel to each of the voltage-driven elements 2a-2f. By switching a direct current voltage supplied from the DC power supply 11 via the smoothing capacitor 12, the inverter unit 13 changes the direct current voltage to an alternating current voltage and supplies the same to an alternating current motor 14. Since each of the six drive units 1a-1f has an equivalent circuit configuration, the six drive units 1a-1f will be described below without making a particular distinction between them.

Figure 2:
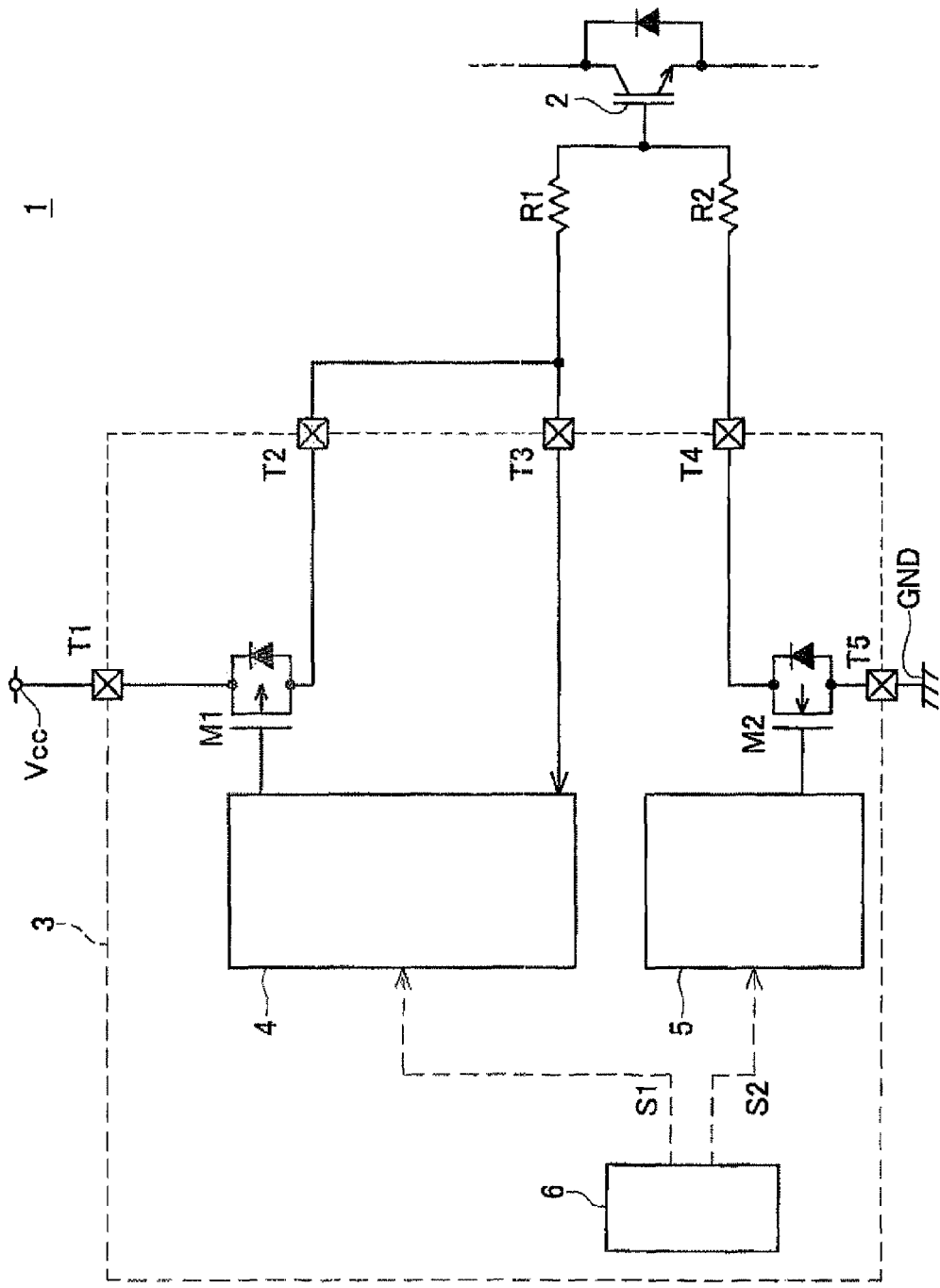
FIG. 2 shows a brief configuration of a drive unit of a first embodiment.

FIG. 2 shows the basic configuration of a drive unit 1 that drives a voltage-driven element 2. The drive unit 1 comprises a pair of gate resistors R1, R2 and a driving IC 3.

As depicted in FIG. 2, the first gate resistor R1 is a fixed resistance element and determines the charging speed of the gate current of the voltage-driven element 2. The second gate resistor R2 is a fixed resistance element and determines the discharging speed of the gate current of the voltage-driven element 2.

The driving IC 3 is configured to be connected between a transformer type driving power source Vcc and a ground power source GND, and to supply the driving voltage to the pair of gate resistors R1, R2. The driving IC 3 comprises a pair of transistors M1, M2, a first controller 4 that controls the first transistor M1, a second controller 5 that controls the second transistor M2, a control block 6 that controls the first controller 4 and the second controller 5, and a plurality of terminals T1-T5. The terminal T1 is a power connector (one example of a second connector) and is configured to be connected to the driving power source Vcc. The terminal T2 is a first output connector (one example of a first connector) and is configured to be connected to the first gate resistor R1. The terminal T3 is a feedback connector and is configured to be connected to the first gate resistor R1. The terminal T4 is a second output connector and is configured to be connected to the second gate resistor R2. The terminal T5 is a ground connector and is configured to be connected to the ground power source GND.

The first transistor M1 is a p-type MOSFET, and is provided between the first output connector T2 and the driving power connector T1. More specifically, a drain electrode (one example of the first input-output electrode) of the first transistor M1 is connected to the first output terminal T2, and a source electrode (one example of the second input-output electrode) of the first transistor M1 is connected to the power connector T1. When the voltage-driven element 2 is turned on, the first transistor M1 is turned on, thereby supplying a positive driving voltage to the insulated gate of the voltage-driven element 2 from the driving power source Vcc via the first transistor M1.

The second transistor M2 is an n-type MOSFET, and is provided between the second output connector T4 and the ground connector T5. More specifically, a drain electrode of the second transistor M2 is connected to the second output terminal T4, and a source electrode of the second transistor M1 is connected to the ground connector T5. When the voltage-driven element 2 is turned off, the second transistor M2 is turned on, thereby supplying a ground voltage to the insulated gate of the voltage-driven element 2 via the second transistor M2.

Based on a control signal supplied from an electronic, control unit (ECU) (not shown), the control block 6 outputs a first driving signal S1 to the first controller 4, and outputs a second driving signal S2 to the second controller 5. The first controller 4 controls the first transistor M1 on/off based on the first driving signal S1. The second controller 5 controls the second transistor M2 on/off based on the second driving signal S2.

Figure 3:
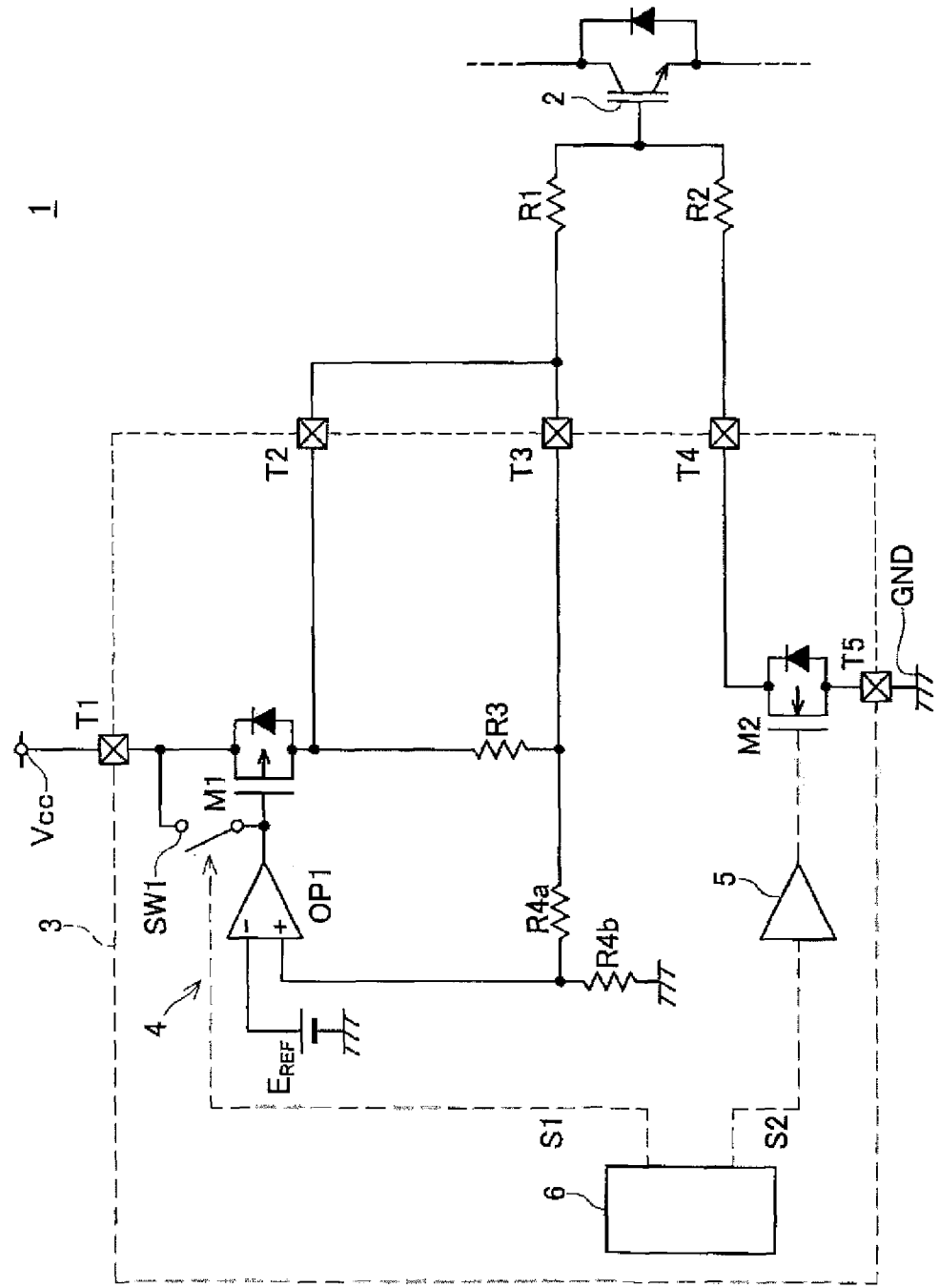
FIG. 3 shows the configuration of the drive unit of the first embodiment (with an amplifier circuit not being connected)
Figure 4:
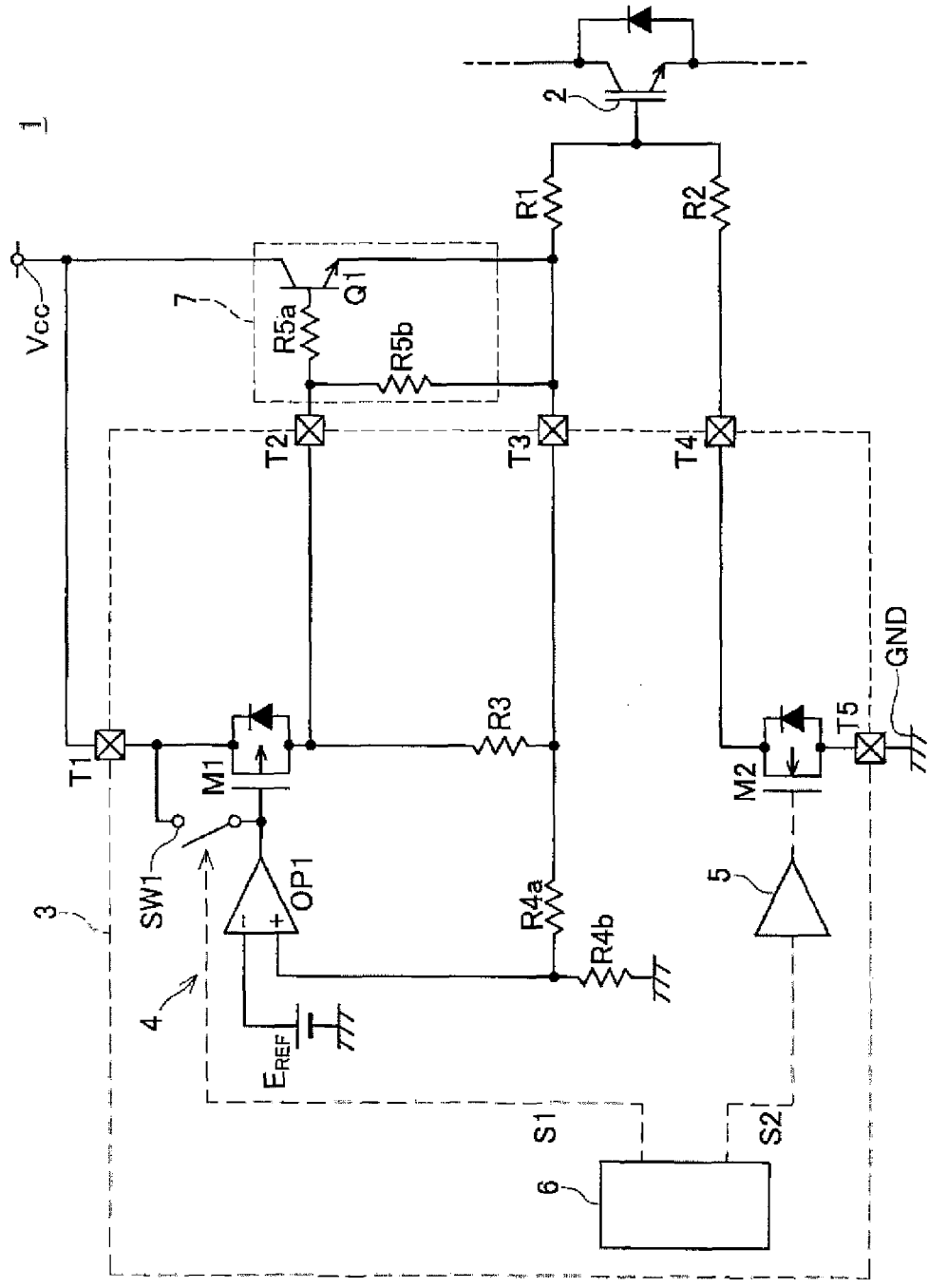
FIG. 4 shows the configuration of the drive unit of the first embodiment (with the amplifier circuit being connected)

As depicted in FIGS. 3 and 4, the drive unit 1 is configured to connect a current amplifier circuit 7 to the driving IC 3 according to needs therefor. FIG. 3 shows the case that the current amplifier 7 is not connected to the driving IC 3, and FIG. 4 shows the case that the current amplifier 7 is connected to the driving IC 3. For example, in the case where the voltage-driven element 2 with small current capacity needs to be driven, the current amplifier circuit 7 is not connected to the driving IC 3. In the case where the voltage-driven element 2 with large current capacity needs to be driven, the current amplifier circuit 7 is connected to the driving IC 3. In this manner, since the current amplifier circuit 7 is configured to be arbitrarily-connectable, a common driving IC 3 can be used for the voltage-driven element 2 with any current capacity.

As depicted in FIGS. 3 and 4, the first controller 4 of the driving IC 3 includes an operational amplifier OP1, a reference power source $E_{REF}$, a switch SW1, a resistor R3 and a voltage-dividing circuit R4a, R4b. Note that a detailed explanation of the second controller 5 is omitted, however, the second controller 5 may have similar configuration of the first controller 4.

A non-inverting input terminal of the operational amplifier OP1 is connected to the reference power source $E_{REF}$, an inverting input terminal of the operational amplifier OP1 is connected to the feedback connector T3 via the voltage-dividing circuit R4a, R4b, and an output terminal of the operational amplifier OP1 is connected to a control electrode of the first transistor M1. One end of the switch SW1 is connected to the power connector T1, and the other end of the switch SW1 is connected to the control electrode of the first transistor M1.

Figure 5:
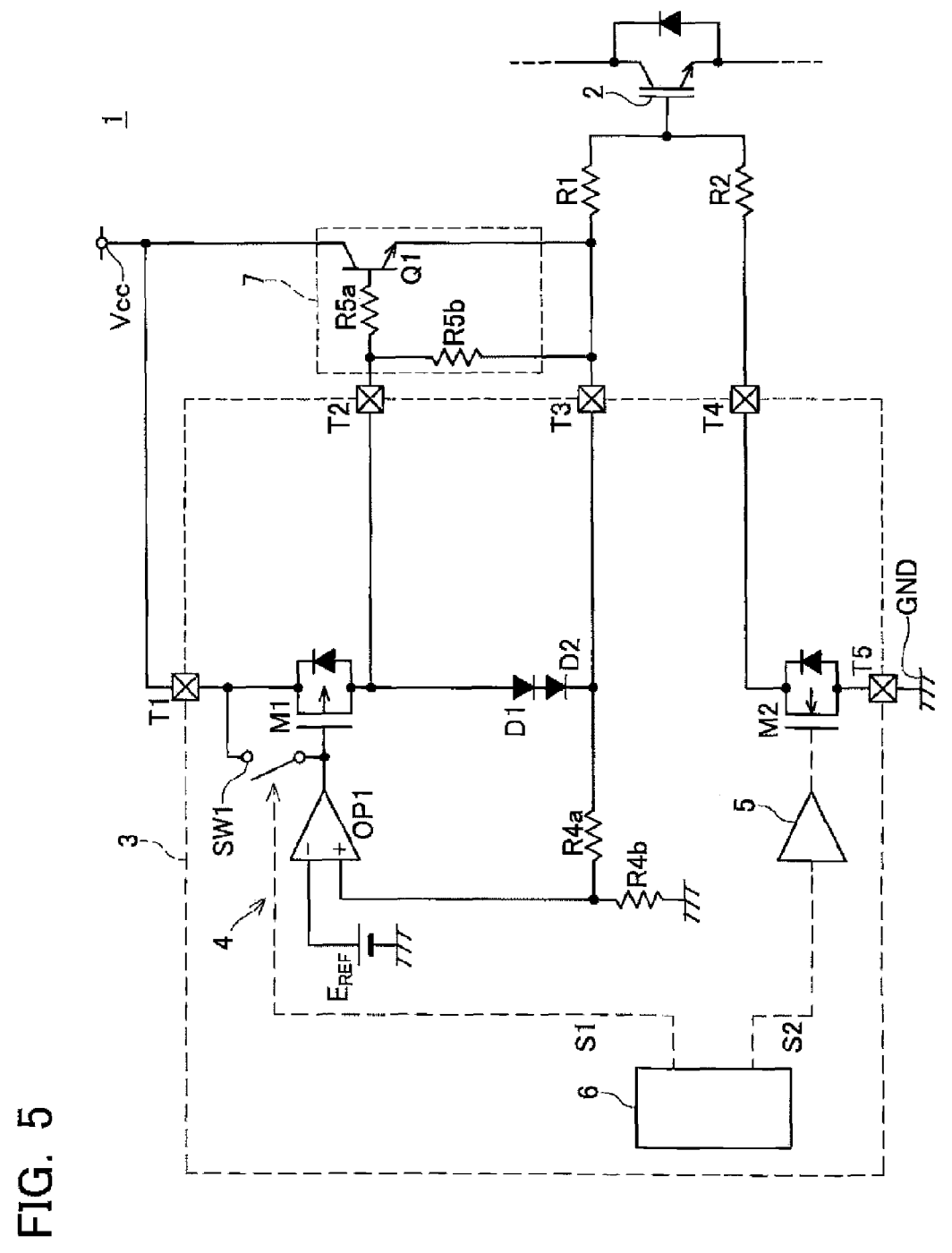

The resistor R3 is fixed resistance element, one end of the resistor R3 is connected to the first output connector T2, and another end of the resistor R3 is connected to the line between the inverting input terminal of the operational amplifier OP1 and the feedback connector T3. Note that, as depicted in FIG. 5, a pair of diodes D1, D2 can be provided instead of the resistor R3. The voltage-dividing circuit R4a, R4b comprises a voltage-dividing regulating first resistor R4a and a voltage-dividing regulating second resistor R4b. The voltage-dividing regulating first resistor R4a and the voltage-dividing regulating second resistor R4b both are fixed resistance elements, and the connecting point thereof is connected to the inverting input terminal of the operational amplifier OP1. Target voltages of the first output connector T2 and the feedback connector T3 are set by adjusting a voltage-dividing ratio of the voltage-dividing regulating first resistor R4a and the voltage-dividing regulating second resistor R4b.

As depicted in FIG. 3, when the external current amplifier circuit 7 is not connected, the first output connector T2 and the feedback connector T3 both are directly connected to the first gate resistor R1. On the other hand, as depicted in FIG. 4, when the external current amplifier circuit 7 is connected, the first output connector T2 is indirectly connected to the first gate resistor R1 via the current amplifier circuit 7, and feedback connector T3 is directly connected to the first gate resistor R1.

As depicted in FIG. 4, the current amplifier circuit 7 comprises a bipolar transistor Q1 and resistors R5a, R5b. The bipolar transistor Q1 is an npn type. An emitter electrode of the bipolar transistor Q1 is connected to the first gate resistor R1, a collector electrode of the bipolar transistor Q1 is connected to the driving power source Vcc, and a base electrode of the bipolar transistor Q1 is connected to the first output connector T2. The resistors R5a, R5b are fixed resistance element, and are connected between base and emitter electrodes of the bipolar transistor Q1. The current amplifier circuit 7 constitutes an emitter follower circuit. Moreover, instead of the bipolar transistor Q1, a transistor having an insulated gate may be used in the current amplifier circuit.

Next, as referring to FIGS. 3 and 4, the operation of the drive unit 1 will be described. First, the normal status that the feedback connector T3 does not open will be described.

In the first controller 4, when the switch SW1 opens based on the first driving signal S1 output from the control block 6, the first transistor M1 turns on. At this time, in the second controller 5, the second transistor M2 turns off based on the second driving signal S2 output from the control block 6. When the first transistor M1 turns on, a positive driving voltage is supplied to the first gate resistor R1 from the driving power source Vcc via the first transistor M1, A divided voltage of the feedback connector T3 by the voltage-dividing circuit R4a, R4b is input to the inverting input terminal of the operational amplifier OP1, and the reference voltage $V_{REF}$ of the reference power source $E_{REF}$ is input to the non-inverting input terminal. Consequently, the first controller 4 compares the divided voltage of the feedback connector T3 by the voltage-dividing circuit R4a, R4b with the reference voltage $V_{REF}$ and, based on the results of this comparison, controls a gate voltage input to the first transistor M1. Consequently, the voltage of the feedback connector T3 is maintained such that it conforms, according to the dividing-voltage ratio, to the reference voltage $V_{REF}$ of the reference power source $E_{REF}$. In the normal status that the feedback connector does not open, since the driving voltage supplied to the first gate resistor R1 is being controlled with high precision, the charging speed of a gate current determined by the first gate resistor R1 is controlled with high precision.

Since the power supply precision of the transformer type driving power source Vcc is low, the output voltage of the driving power source Vcc is known to fluctuate within the range of a few volts. Consequently, in the case where the technique of the present embodiment is not used, when the output voltage of the driving power source Vcc fluctuates lower, the charging speed of the gate current decelerates below a set value, the time required to turn on the voltage-driven element 2 becomes longer, and the switching loss increases. On the other hand, when the output voltage of the driving power source Vcc fluctuates higher, the charging speed of the gate current accelerates above the set value, the rate-of-change of current for turning on the voltage-driven element 2 increases, and the surge voltage occurs.

In the drive unit 1 of the present embodiment, by performing feedback control of the feedback connector T3 using the high precision reference power source $E_{REF}$, the output voltage of the driving power source Vcc is not affected by fluctuation, and the voltage supplied to the first gate resistor R1 can be controlled with extremely high precision.

Next, the abnormal status in which the feedback connector T3 opens will be described. When in the abnormal status, the feedback path from the feedback connector T3 to the operation amplifier OP1 is blocked off. At this time, in the drive unit 1, the current flows via the resistor R3, then, the feedback path from the first output connector T2 to the operation amplifier OP1 is ensured. That is, in the abnormal status, the voltage of the first output connector T2 is under the feedback control. In this case, the voltage of the first output connector T2 slightly clamps by the resistor R3, however, variety of the driving voltage is repressed and the phenomenon that the driving voltage supplied to the first gate resistor R1 rises up to the driving power source Vcc level is avoided because the feedback control is maintained.

The clamp value of the first output connector T2 is the product of the current flowing to the resistor R3 and the resistance of the resistor R3. In order not to disturb the operation of the current amplifier circuit 7, this claim value is set to be higher than the voltage between the base and emitter of the bipolar transistor Q1. More specifically, when the resistance of the resistor R3 is set to be high (in the embodiment of FIG. 5, number of diodes D1 and D2 connected in series is adjusted), the operation of the current amplifier circuit 7 is not disturbed.

The drive unit 1 is characterized in that the switch SW1 is connected between the power connector T1 and the control electrode of the first transistor M1. For example, if the switch SW1 is provided on the feedback path, the precision of the feedback is lowered by the characteristic variability of the switch SW1 (e.g. variability of on-resistance). On the other hand, in the drive unit 1, the switch 1 is not provided on the feedback path, so the high precision driving voltage can be supplied to the first gate resistor R1. Therefore, the drive unit 1 of the present embodiment can control the charging speed of the gate current determined by the first gate resistor R1 with high precision, and since the voltage-driven element 2 can be driven with high precision, the occurrence of unintended surge voltage or an increase in switching loss can be suppressed.

Second Embodiment

Figure 6:
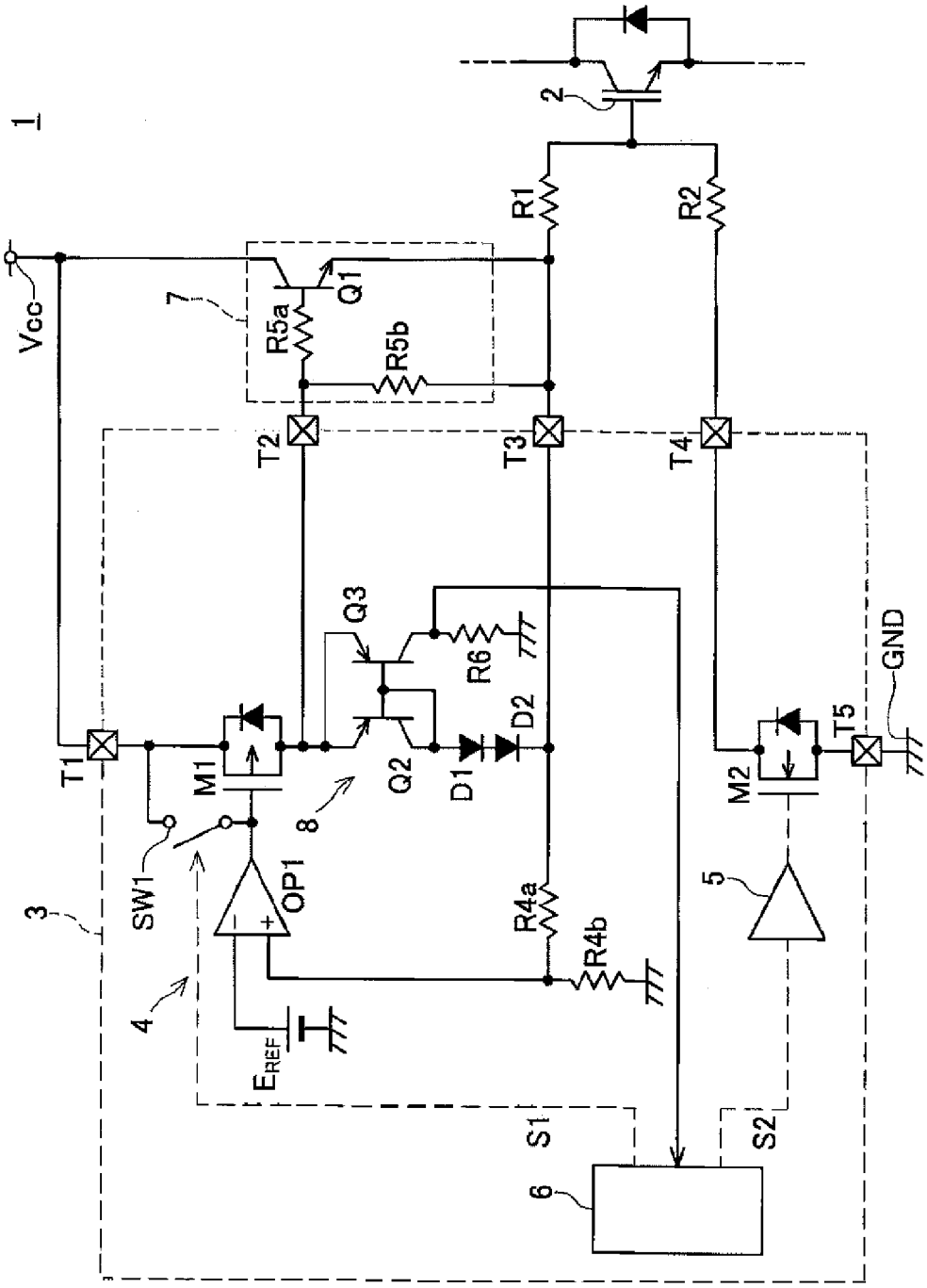
FIG. 6 shows a configuration of a drive unit of a second embodiment.

FIG. 6 shows the configuration of a drive unit 1 of a second embodiment. This drive unit 1 is characterized in that a current detector 8 is provided to detect a current flowing in the pair of diodes D1, D2. Note that only one of the pair of diodes D1, D2 may be provided. The current detector 8 is constituted as a current mirror circuit, and comprises a pair of pnp transistors and a resistor R6. When the feedback connector T3 opens, the current detector 8 mirrors a current flowing in the pnp transistor Q2 and diodes D1, D2 to pnp transistor Q3, and provides a voltage signal based on this mirror current to the control block 6. The control block 6 decides whether the feedback connector T3 open when the voltage signal based on the mirror current is over a threshold value.

When the feedback connector T3 opens, the clamp voltage at the first output connector T2 is, for example, about 0.1 to 2V. As above, since the clamp voltage is very small, it is difficult to decide whether the feedback connector T3 open by using of the claim voltage. On the other hand, using of the current detector 8 allows a precise decision of the feedback connector T3 being opened. If the decision of the feedback connector T3 being opened is made, it allows arbitrarily-adjustment for the driving setting according to the abnormal status. For example, in abnormal status, the driving voltage is high depending on the clamp voltage (in sum of a forward voltage on diodes D1, D2 and a voltage between the base and emitter on the transistor Q2). Therefore, if a similar drive condition as the normal status is remained even in the abnormal status, a product lifetime may be shorter. As mentioned above, there is a need to change the driving setting in abnormal status and the normal status respectively. The drive unit 1 in this embodiment can decide the abnormal status, thus, for example, the product life time may be repressed to be shorter by arbitrarily adjusting the driving setting.

Figure 7:
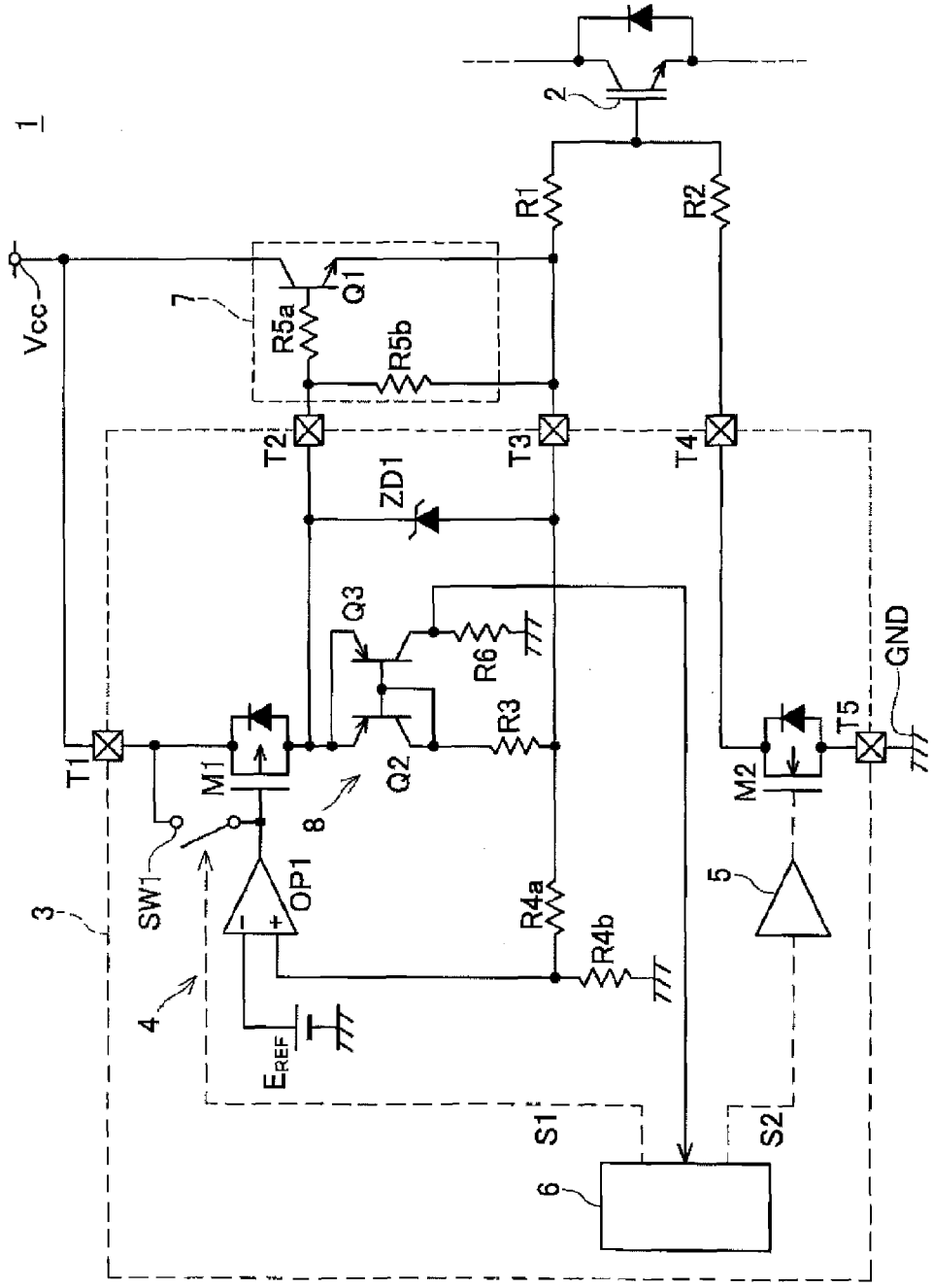
FIG. 7 shows a configuration of a drive unit of a modified example of the second embodiment.

FIG. 7 shows one modified example of drive unit 1 in a second embodiment. This drive unit 1 is characterized in that a zener diode ZD1 connected in parallel with the current detector 8 is provided. An anode of the zener diode ZD1 is connected to the feedback connector T3 and a cathode of the zener diode ZD1 is connected to the first output connector T2. Further, this drive unit 1 is characterized in that the resistor 3 is connected in series with the diode D1. Note that the resistor 3 operates as a current-limiting resistor so that it represses a large current flowing in the current detector 8.

The zener diode ZD1 can conduct at and over a predetermined voltage. Here, the predetermined voltage is higher than an operating voltage of the current detector 8. In this manner, the zener diode ZD1 normally does not disturb the operation of the current detector 8. On the other hand, when an excessive voltage (e.g. electrostatic discharge sensitive devices: ESD) is applied to the current detector 8, the zener diode 8 preferentially conducts, and thereby protects the current detector 8 from the excessive current flowing therethrough.

Figure 8:
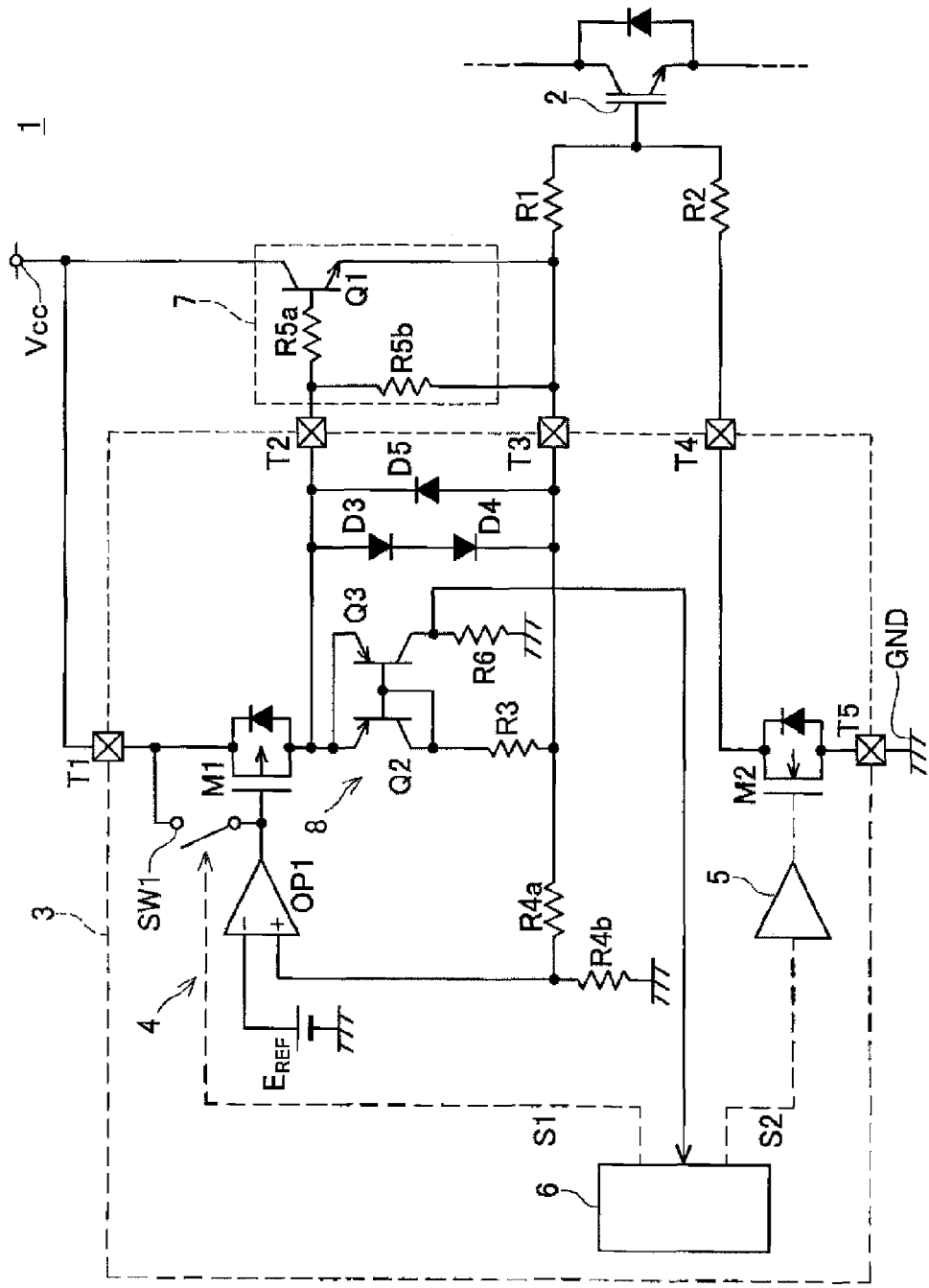
FIG. 8 shows a configuration of a drive unit of another modified example of the second embodiment.

As depicted in FIG. 8, a plurality of diodes D3-D5 may be used as a protection element instead of the zener diode ZD1. The diode D3 and the diode D4 are connected in series, an anode of the diode D3 is connected to the first output connector T2, and a cathode of the diode D4 is connected to the feedback connector T3. An anode of the diode D5 is connected to the feedback connector T3, and a cathode of the diode D5 is connected to the first output connector T2. Diodes D3-D5 also provide similar effect as the above zener diode ZD1.

Specific examples of the present invention are described above in detail, but these examples are merely illustrative and place no limitation on the scope of the patent claims. The technology described in the patent claims also encompasses various changes and modifications to the specific examples described above.

The technical elements explained in the present specification or drawings provide technical utility either independently or through various combinations. The present invention is not limited to the combinations described at the time the claims are filed. Further, the purpose of the examples illustrated by the present specification or drawings is to satisfy multiple objectives simultaneously, and satisfying any one of those objectives gives technical utility to the present invention.

The invention claimed is:

1. A drive unit for driving a voltage-driven element, the drive unit comprising:
   a first connector configured so as to be connected to a gate resistor of the voltage-driven element;
   a feedback connector configured so as to be connected to the gate resistor of the voltage-driven element;
   a second connector configured so as to be connected to a driving power source;
   a switching element having a first input-output electrode connected to the first connector and a second input-output electrode connected to the second connector; and
   a controller connected to a control electrode of the switching element and the feedback connector, wherein
   the controller is configured so as to:
   (1) control a voltage supplied to the gate resistor of the voltage-driven element by using a voltage at the feedback connector when an electrical connection between the feedback connector and the gate resistor of the voltage-driven element is ensured, and
   (2) control the voltage supplied to the gate resistor of voltage-driven element by using a voltage at the first connector when the electrical connection between the feedback connector and the gate resistor of the voltage-driven element is not ensured.

2. The drive unit according to claim 1, wherein
   the controller includes an error amplifier, a reference power source, and a resistance member,
   the error amplifier has one input connector connected to the reference power source, an other input connector connected to the feedback connector, and an output connector connected to the control electrode of the switching element, and
   the resistance member has one end connected to the first connector, and an other end connected to a line between the other input connector of the error amplifier and the feedback connector.

3. The drive unit according to claim 2, wherein
   the controller further includes a switch, and
   the switch has one end connected to the second connector, and an other end connected to the control electrode of the switching element.

4. The drive unit according to claim 3, wherein
   the switch is configured so as to open in synchrony with a turn-on of the voltage-driven element.

5. The drive unit according to any one of claims 2 to 4, wherein
   the controller further includes a current detector which detects a current flowing in the resistor member.

6. The drive unit according to claim 5, wherein
   the controller further includes a protection element in parallel with the current detector, wherein the protection element conducts at and over a predetermined voltage, and
   the predetermined voltage is higher than an operating voltage of the current detector.

7. The drive unit according to any one of claims 1 to 6, further comprising:

a current amplifier circuit which amplifies an output current from the first connector and provides it to the gate resistor.

\* \* \* \* \*